United States Patent [19]
Dahlberg

[11] 4,449,286
[45] May 22, 1984

[54] METHOD FOR PRODUCING A SEMICONDUCTOR LAYER SOLAR CELL

[75] Inventor: Reinhard Dahlberg, Flein, Fed. Rep. of Germany

[73] Assignee: Licentia Patent-Verwaltungs GmbH, Frankfurt am Main, Fed. Rep. of Germany

[21] Appl. No.: 315,641

[22] Filed: Oct. 27, 1981

Related U.S. Application Data

[63] Continuation-in-part of Ser. No. 169,128, Jul. 15, 1980, abandoned.

[30] Foreign Application Priority Data

Oct. 17, 1979 [DE] Fed. Rep. of Germany ....... 2941908

[51] Int. Cl.³ .................. H01L 31/18; B05D 1/00
[52] U.S. Cl. ................................... 29/572; 136/255; 136/258; 148/1.5; 148/174; 427/34; 427/74; 427/86
[58] Field of Search ............ 29/572; 427/34, 74, 427/86; 136/255, 256, 258 PC, 258 AM, 261; 357/15, 30; 148/1.5, 174; 219/121 PL, 121 PY

[56] References Cited

U.S. PATENT DOCUMENTS

| | | | |
|---|---|---|---|
| 2,034,334 | 3/1936 | Falkenthal | 136/264 |
| 3,922,214 | 11/1975 | Van Cakenberghe | 204/298 |
| 4,003,770 | 1/1977 | Janowiecki et al. | 148/174 |
| 4,059,461 | 11/1977 | Fan et al. | 148/1.5 |
| 4,078,097 | 3/1978 | Miller | 427/34 |
| 4,140,546 | 2/1979 | Krimmel | 148/1.5 |
| 4,161,418 | 7/1979 | Morimoto et al. | 148/175 |
| 4,166,880 | 9/1979 | Loferski et al. | 428/457 |
| 4,240,842 | 12/1980 | Lindmayer | 136/256 |
| 4,292,342 | 9/1981 | Sarma et al. | 427/34 |

FOREIGN PATENT DOCUMENTS

| | | |
|---|---|---|
| 973156 | 12/1959 | Fed. Rep. of Germany . |
| 2805247 | 8/1978 | Fed. Rep. of Germany . |
| 2824564 | 12/1978 | Fed. Rep. of Germany . |
| 2924584 | 1/1981 | Fed. Rep. of Germany . |
| 2941908 | 4/1981 | Fed. Rep. of Germany . |
| 3016807 | 5/1981 | Fed. Rep. of Germany . |
| 1526416 | 9/1978 | United Kingdom . |

OTHER PUBLICATIONS

David L. Pulfrey, "MIS Solar Cells: A Review", IEEE Transactions on Electron Devices, vol. ED-25, No. 11, Nov. 1978, pp. 1308-1317.
Erich Kasper, "Molekularstrahl-Epitaxie von Silizium", AEG-Telefunken 52, 1979, pp. 147 to 155.

Primary Examiner—Aaron Weisstuch
Attorney, Agent, or Firm—Spencer, Kaye & Frank

[57] ABSTRACT

A method for producing a semiconductor solar cell in which a layer of semiconductor material is applied to a substrate by means of plasma spraying. The energy density in the plasma zone is maintained sufficiently high that the semiconductor vaporizes and is brought out of the plasma zone in the form of a vapor jet, which is condensed on the substrate in the form of a semiconductor layer.

22 Claims, 5 Drawing Figures

METHOD FOR PRODUCING A SEMICONDUCTOR LAYER SOLAR CELL

CROSS-REFERENCE TO RELATED APPLICATION

This application is a continuation-in-part application of my copending U.S. Application Ser. No. 169,128, filed July 15, 1980, now abandoned.

BACKGROUND OF THE INVENTION

The present invention relates to the field of solar cells and methods for forming solar cells from semiconductor materials.

In order to utilize solar energy to generate electricity, solar cells made of monocrystalline semiconductor wafers or discs can be used only for special applications. Their manufacturing cost and the amount of energy consumed in their manufacture is so high that the use of monocrystalline cells makes sense only together with solar radiation concentrators. With such concentrators, care must be taken that sufficient cooling is provided for the solar cells.

Much more economical solar cells can be manufactured from amorphous or polycrystalline semiconductor layers. Amorphous silicon layers, for example, can be produced by vapor deposition of silicon in a vacuum or by cathode atomization or high frequency atomization of silicon in a hydrogen containing atmosphere. While solar cells of amorphous silicon have the drawback that their degree of efficiency is only a few percent, solar cells of polycrystalline silicon can be produced with degrees of efficiency 10%. Particularly high efficiency is produced by a polycrystalline silicon material in which the crystallites have a preferred direction. The polycrystalline silicon for solar cell production is manufactured, for example, by casting liquid silicon in the form of a bar having a square cross section. The liquid silicon solidifies into bars with a temperature gradient. After cooling, the solidified bar is sawed or sliced into wafers from which the solar cells are made. Alternatively, the liquid silicon can be cast directly in the form of a plate, eliminating the requirement for sawing or slicing.

It is also known to immerse a suitable substrate, e.g., graphite, into a silicon melt so that the substrate when removed from the melt, is covered with a thin coating of silicon. This silicon coating on the substrate can then be processed further into a solar cell. A substrate with a coating of a Group III/Group V compound, such as a thin coating of GaAs, can be produced in a similar manner and it can then be processed further into a solar cell.

It is known to form a polycrystalline semiconductor layer solar cell by employing a plasma spray to form the semiconductor layer as disclosed in U.S. Pat. No. 4,003,770 to Janowiecki et al.

SUMMARY OF THE INVENTION

It is an object of the present invention to provide a method for producing a semiconductor layer solar cell which reduces the manufacturing cost for a semiconductor layer solar cell as compared to thermal deposition or chemical vapor deposition.

It is a further object of the present invention to provide a method for producing a semiconductor layer solar cell which further reduces the amount of energy consumed during manufacture of a semiconductor layer solar cell as compared to thermal deposition or chemical vapor deposition.

Another object of the present invention is to provide a method for producing a semiconductor layer solar cell having a silicon layer which is more homogeneous than that produced in normal plasma processes.

To achieve these objects, and in accordance with its purpose, the present invention provides an improvement in a method for producing a semiconductor layer solar cell by applying a semiconductor layer to a substrate by plasma spraying in which a semiconductor material is brought out of the plasma zone of a plasma spraying means. The improvement comprises maintaining the energy density in the plasma zone sufficiently high that the semiconductor vaporizes and is brought out of the plasma zone in the form of a vapor jet, and condensing the vapor on the substrate in the form of a semiconductor layer.

It is to be understood that both the foregoing general description and the following detailed description are exemplary, but are not restrictive of the invention.

BRIEF DESCRIPTION OF THE DRAWINGS

The accompanying drawings, in which like numbers indicate like parts, illustrate examples of presently preferred embodiments of the invention and, together, with the description, serve to explain the principles of the invention.

In the drawings.

DETAILED DESCRIPTION OF THE INVENTION

Figure 1:
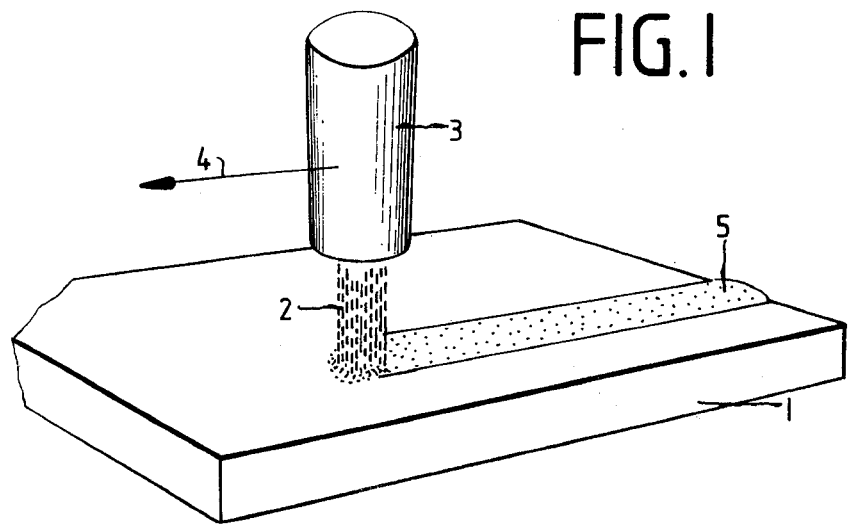
FIG. 1 shows the application of a semiconductor layer of a substrate by electric arc plasma spraying in accordance with the teachings of one embodiment of the present invention.

According to the method of the invention, the semiconductor material to be processed to form the cell may be present in rod or powder form. In either case, the semiconductor material is applied to a substrate by plasma spraying in which the energy density in the plasma zone is maintained sufficiently high that the semiconductor material vaporizes. The semiconductor material, whether in rod or powder form, is vaporized in an electric arc or in plasma and is propelled in the form of a vapor jet of semiconductor material onto the substrate, where the vapor is condensed in the form of a semiconductor layer. The semiconductor layer generally has a thickness less than about $5 \times 10^{-2}$ cm, and preferably is from $2 \times 10^{-3}$ to $2 \times 10^{-2}$ cm, for silicon.

Semiconductor materials applicable for use according to the method of the present invention are n and p conductive elemental semiconductors, such as, for example, silicon, germanium, carbon, and boron, or Group III/Group V compound semiconductors such as, for example, AlSb, GaAs, and InP, or Group II-/Group VI compound semiconductors, such as CdTe, and CdS.

Where silicon is used as the semiconductor material the elemental silicon can be produced, for example, according to one of the following well known reactions.

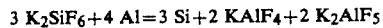

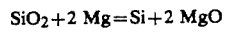

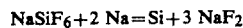

In accordance with well known techniques, by pulverizing and treating the reaction product with HCl, the silicon powder can be separated from the metallic Al, Mg, or Na, respectively. The silicon powder so obtained can be applied directly to a substrate by means of plasma spraying as described herein to form a polycrystalline silicon layer.

The substrate may be made of an electrically conductive material, such as, for example, aluminum or steel. The substrate then simultaneously forms the rear electrical contact of the solar cell.

The substrate may also be made of an electrically insulating material, such as glass, porcelain, ceramic, plastic, and the like. In that case, the substrate is coated at least in part with an electrically conductive layer of, for example, a metal such as Al, Fe, Mo, or a carbide, such as $MoC_2$, or a boride such as $ZrB_2$ or nitride such as TiN or oxide such as TiO for formation of the electrical rear contact. The thickness of such an electrically conductive layer preferably is between about $2 \times 10^{-4}$ to $5 \times 10^{-2}$ cm.

According to the present invention, the application of the semiconductor material onto the substrate is preferably effected in a vacuum or in an oxygen-free atmosphere which serves, at least in part, as a carrier gas and comprises a noble gas atmosphere, or a hydrogen atmosphere, or a nitrogen atmosphere, or mixtures thereof.

However, the atmosphere may also contain gases, such as HCl, HF, $Cl_2$, $I_2$, and $S_2$ and the like which are non-reactive or slightly reactive with the semiconductor material, but are highly reactive with the impurities in the semiconductor vapor. Thus, it is possible to purify the semiconductor material during the plasma spraying process of the present invention. The amount of the reactive gases, which can be present in the atmosphere, can be up to a few percent such as, for example 1 to 3 percent. The temperature of the atmosphere during spraying generally is in the range between 5,000° C. and 40,000°C.

Methods used for plasma spraying are well known to those skilled in the art. In one such method, an electric arc is typically produced between two rods of the material to be sprayed, which serve as electrodes, and a strong stream of gas is blown through this arc and forms a plasma zone. In the method according to the present invention, the energy density in the plasma zone is maintained sufficiently high so that the rod material melts and vaporizes in the electric arc, and is propelled by the gas stream in the form of a vapor jet onto a substrate, where it condenses into a layer.

In another method, the semiconductor material to be sprayed, usually in powder form, is blown with the aid of an inert gas stream through an electric arc between cooled electrodes, e.g., tungsten electrodes, in an inert atmosphere. In the method according to the present invention, the energy density in the plasma zone of the electric arc is maintained sufficiently high so that the semiconductor material vaporizes in the plasma zone of the electric arc, and is propelled onto a substrate as a vapor jet to condense there in the form of a layer. The semiconductor material may, in this method, also be in the form of a rod extending into the plasma zone, in which case, the end of the rod melts and vaporizes.

The plasma spraying means in one embodiment of the present invention comprises two electrodes made of semiconductor material. The plasma spraying means can include electrodes of a semiconductor material which vaporizes in the plasma, and is condensed on the substrate.

In one embodiment of the plasma spraying, the plasma of the plasma spraying system burns only in the vapor of the semiconductor material. For burning of a plasma it is necessary to have a gas in which plasma can burn. If the temperature of the ends of the silicon electrodes is high enough, then the vapor pressure of the semiconductor material becomes high enough that a plasma can burn in the vapor of the semiconductor material.

In another embodiment, the plasma spraying system is water stabilized and the plasma burns in dissociated water vapor in an excess of hydrogen. If the electric arc (with sufficient electrical power) is burning in pure water, then the arc generates a channel filled up with dissociated water vapor in which the plasma is burning. The surrounding water "stabilizes" the vapor-channel and the burning plasma.

In the normal plasma spraying process, for example, according to U.S. Pat. No. 4,003,770, silicon powder particles are blown through the plasma zone by means of a gas stream. The silicon powder particles in the normal plasma spraying process are melted in the plasma zone into fine droplets which are removed from the plasma zone together with the gas stream and are precipitated on a substrate. This process produces on the substrate a silicon layer which is composed of solidifying silicon droplets. This layer is always somewhat porous, not very homogeneous and poorly suited for the production of high efficiency solar cells. In the plasma spraying process according to the present invention, however, the energy density in the plasma and the period of dwell of the semiconductor material in the plasma are selected to be so high that the semiconductor material not only melts but evaporates or sublimates, respectively. In this case, the gas stream brings the semiconductor material out of the plasma zone in the form of vapor. On the substrate, the semiconductor material is precipitated from the vapor phase, similar to the thermal evaporation of semiconductor material in a high vacuum or in "chemical vapor deposition". The plasma spraying process according to the present invention is much more economical than these processes and also furnishes homogeneous crystalline semiconductor layers. Further, in the normal plasma spraying process, for example that according to U.S. Pat. No. 4,003,770, a certain percentage of silicon particles is always evaporated in the plasma. However, this effect is undesirable in principle and the resulting silicon vapor is not precipitated on the substrate but sucked away. The plasma spraying process according to the present invention, however, makes this undesirable ancillary effect the production method for the semiconductor layers. The evaporation of the semiconductor material, which material can be either in the form of powder that is added or in the form of the material of the electrodes, can be effected by employing a sufficiently high energy density in the plasma (high current plasma) and a sufficiently long period of dwell of the semiconductor material in the plasma zone (slower velocity of the gas stream). While for the normal plasma spraying process electrical power of 40 to 80 kW is sufficient, and gas velocities at supersonic speed are customary, the plasma spraying process according to the present invention operates typically with electrical power in the range about 100 kW and with gas velocities below the speed of sound.

In order to influence adhesion, produce a reaction with the substrate material or realize a certain average cyrstalline size in the semiconductor material, it may be of advantage to employ an elevated substrate temperature (higher than room temperature) during application of the semiconductor layer. Preferably, the substrate will have a temperature greater than 200° C. during the application of the semiconductor layer, such as a temperature of 300° to 1200° C.

With the use of a mask it is also possible to apply the semiconductor layer to the substrate in a structured manner, that is, in a pattern.

Due to the high electric arc or plasma temperatures, a semiconductor layer of a compound semiconductor such as, for example, AlSb, can also be applied onto the substrate by spraying a suitable powder mixture of the respective compound elements, with the compound being formed in the electric arc or plasma jet. In the case of AlSb, a mixture of aluminum powder and antimony powder would be sprayed.

After application of the semiconductor layer onto the substrate, the substrate can be tempered or heated together with the semiconductor layer in order to, for example, improve the semiconductor properties of the layer. The tempering temperature for polycrystalline silicon preferably is in a range between 500° C. and 1200° C. and the tempering time preferably is between one hour and a few minutes.

Also, after application of the semiconductor to the carrier, the semiconductor layer may also be heated or melted from one side for a short time by means of an electric arc or plasma jet. This heating or melting is similar to a heating up or annealing by means of a focused laser beam, but it is much less expensive. The time for heating or melting generally is less than one second. The semiconductor layer can, of course, also briefly be heated or melted with the aid of a focused light beam or a focused laser beam for this purpose.

According to one embodiment of the invention, the solar cell has a pn junction near the surface on the exposed or free side of the semiconductor layer, that is, on the side removed from the substrate. This pn junction can be produced by known methods, such as, for example, by diffusion, ion implantation, or epitaxial growth.

According to another embodiment of the invention, the exposed side of the semiconductor layer is provided with a light-transmitting Schottky contact. This Schottky contact can be produced in a known manner, such as, for example, by vapor-deposition, sputtering, spraying or chemical deposition of a metallic conductive layer which preferably has a thickness of less than $2 \times 10^{-5}$ cm, and most preferably a thickness of about $5 \times 10^{-6}$ cm.

It is also possible to provide the exposed side of the semiconductor layer of the present invention with a light transmitting hetero-junction. This hetero-junction can be produced, for example, by the application of a light transmitting semiconductor layer of $SnO_2$, $In_2O_3$, $WO_2$, $V_2O_3$, $Ti_2O_3$, $Cu_2O$, $Nb_2O_3$, $GeTe$, or the like, preferably to a thickness of less than $2 \times 10^{-4}$ cm, and most preferably to a thickness of about $2 \times 10^{-5}$ cm.

Since metal/insulator/semiconductor Structures (MIS) and semiconductor/insulator/semiconductor (SIS) Structures produce particularly high degrees of efficiency, it is advantageous to coat the semiconductor layer with an insulating layer whose thickness is less than $1 \times 10^{-6}$ cm, preferably about $2 \times 10^{-7}$ cm. The metal layer for the Schottky contact of the semiconductor layer for the heterojunction is then disposed on this thin insulating layer. A suitable insulating layer is an $SiO_2$ layer.

The Schottky contact or hetero-junction on the semiconductor layer may also be designed, according to the present invention, as a mechanical pressure contact between the semiconductor layer and a light transmitting molded body. The molded body is then coated, at least at the pressure contact, with a light transmitting metal layer or with a light transmitting semiconductor layer.

The contacts for the frontal side of the semiconductor layer (at the pn-junction, at the Schottky barrier or at the hetero-junction) and/or at the rear face can be applied with the aid of electric arc or plasma spraying. Arc spraying or plasma spraying of contacts is described, for example, in U.S. Pat. No. 4,240,842 to Lindmayer.

The following examples are given by way of illustration to further explain the principles of the invention. These examples are merely illustrative and are not to be understood as limiting the scope and underlying principles of the invention in any way. All percentages referred to herein are by weight unless otherwise indicated.

EXAMPLE 1

With reference to FIG. 1, there is shown a substrate 1 made of aluminum and an electric arc plasma spraying means. Nitrogen is blown through an electric arc formed between two p-conductive silicon rod electrodes (not shown), and towards the substrate through a nozzle 3. The silicon melts and vaporizes in the electric arc and is propelled onto substrate 1 by the nitrogen in the form of a nitrogen jet 2 heated by the electric arc. On the substrate, the silicon vapor condenses to form a p-conductive polycrystalline silicon layer 5. The nozzle 3 with the electric arc nitrogen jet 2 is moved laterally in the direction of arrow 4 to produce a uniformly thick silicon layer 5 on substrate 1.

EXAMPLE 2

Figure 2:
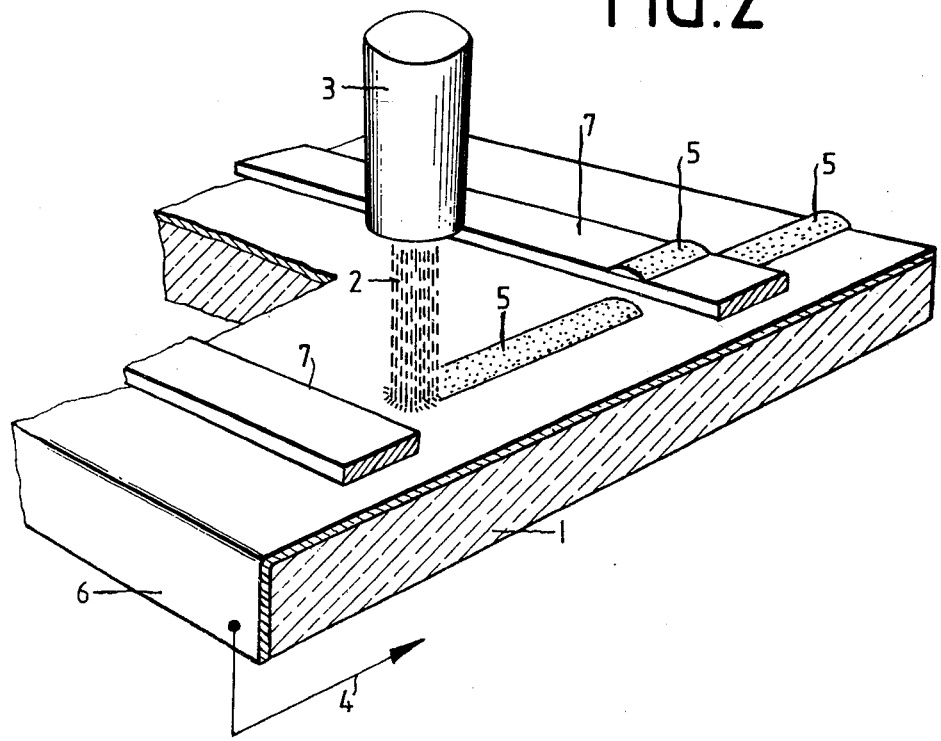
FIG. 2 shows the application of a semiconductor layer onto a substrate in a patterned structure by plasma spraying in an oxygen-free atmosphere containing phosphine in accordance with a further embodiment of the present invention.

Referring now to FIG. 2, there is shown a substrate 1 of glass which is provided on its upper face with an aluminum layer 6. N-conductive silicon powder is blown with the aid of an argon plasma jet 2 through an electric arc burning between cooled tungsten electrodes, and passes from a nozzle 3, towards a mask 7 and substrate 1. The atmosphere surrounding plasma jet 2 contains phosphine gas. The silicon particles are vaporized in plasma jet 2 and the vapor jet condenses on aluminum layer 6 to form n-conductive silicon layer 5. In this process, glass substrate 1 is moved laterally in the direction of arrow 4.

EXAMPLE 3

Figure 3:
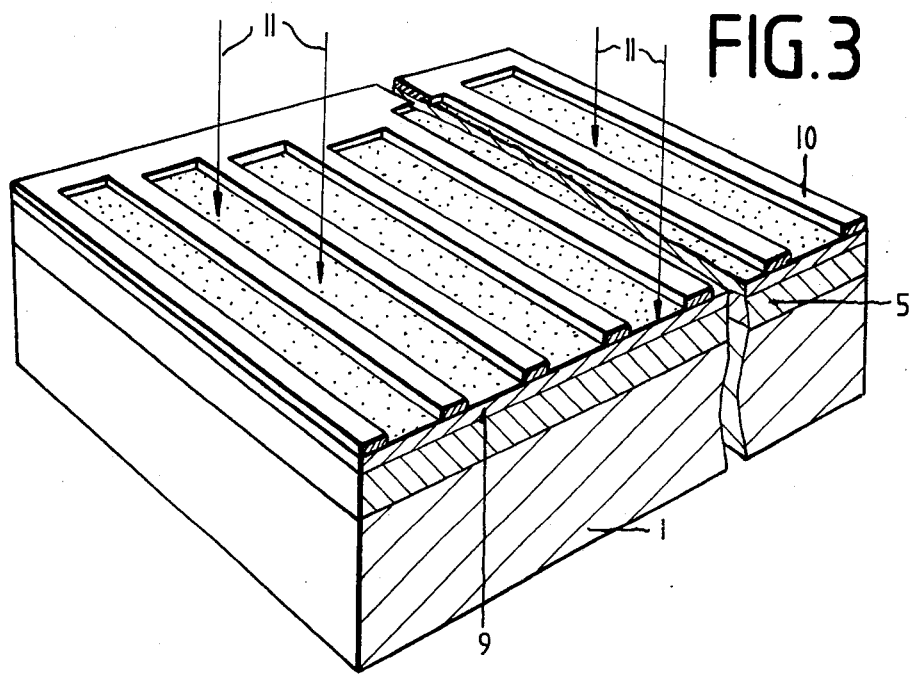
FIG. 3 is a cross-sectional view of the structure of a semiconductor layer solar cell on a metal substrate with a p-conductive silicon layer and a pn junction produced in accordance with the teachings of the present invention.

Turning now to FIG. 3, there is shown a p-conductive silicon layer 5 which is produced, by means of a plasma jet process according to the invention, on an aluminum alloy substrate 1. The layer has a thickness of $4 \times 10^{-2}$ cm and an ohmic resistivity of 0.1 ohm cm. By implanting phosphorus ions in the exposed surface of silicon layer 5, an n+-conductive layer 9 is produced near the surface. A comb-shaped aluminum contact 10 is provided on the frontal face. Solar irradiation 11 produces a photovoltage between frontal face contact 10 and aluminum substrate 1.

EXAMPLE 4

Figure 4:
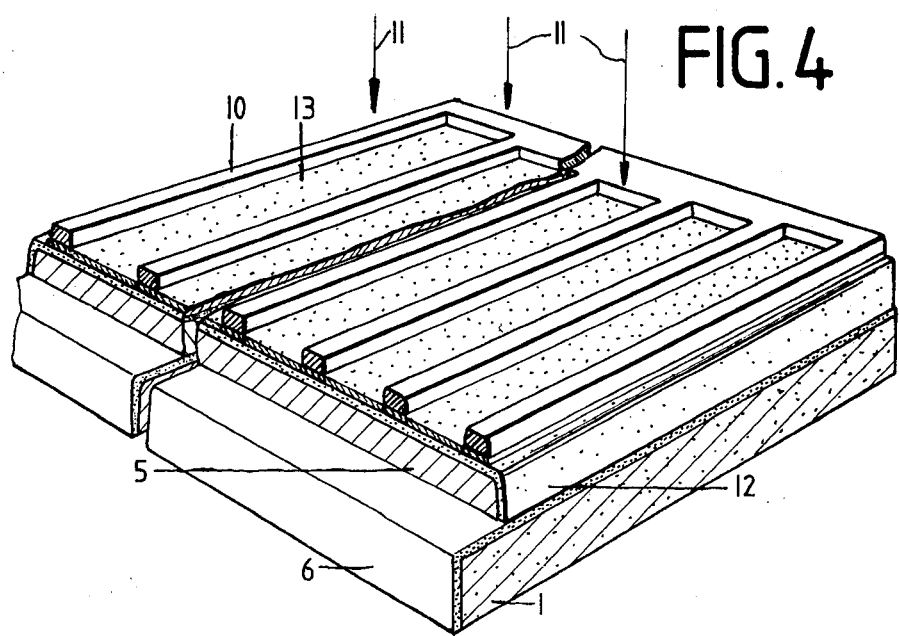
FIG. 4 is a cross-sectional view of the structure of a semiconductor layer solar cell on a metallized insulator substrate with an n-conductive silicon layer and MIS Structure produced in accordance with the teachings of the present invention.

As shown in FIG. 4, a substrate 1 of porcelain is coated on its upper side with layer 6 of TiO having a thickness of $5 \times 10^{-3}$ cm. On this TiO layer 6, there is applied an n-conductive silicon layer 5, with the aid of a plasma jet according to the invention wherein the silicon is vaporized. The n-conductive silicon layer 5 has a thickness of $1.5 \times 10^{-2}$ cm and has a specific resistivity of $1 \times 10^{-2}$ ohm cm. After its application, the surface of this layer is very briefly melted by means of a laser beam. The molten surface is coated with a layer 12 of $SiO_2$, formed by oxidation in an oxygen containing atmosphere, to a thickness of $2 \times 10^{-7}$ cm. Onto this $SiO_2$ layer 12 there is deposited, in a vacuum, a nickel layer 13 of a thickness of $2 \times 10^{-6}$ cm so that an MIS structure is produced. A comb-shaped copper layer 10 constitutes the frontal face contact of the solar cell. Solar irradiation 11, produces a photovoltage between TiO layer 6 and copper layer 10.

EXAMPLE 5

Figure 5:
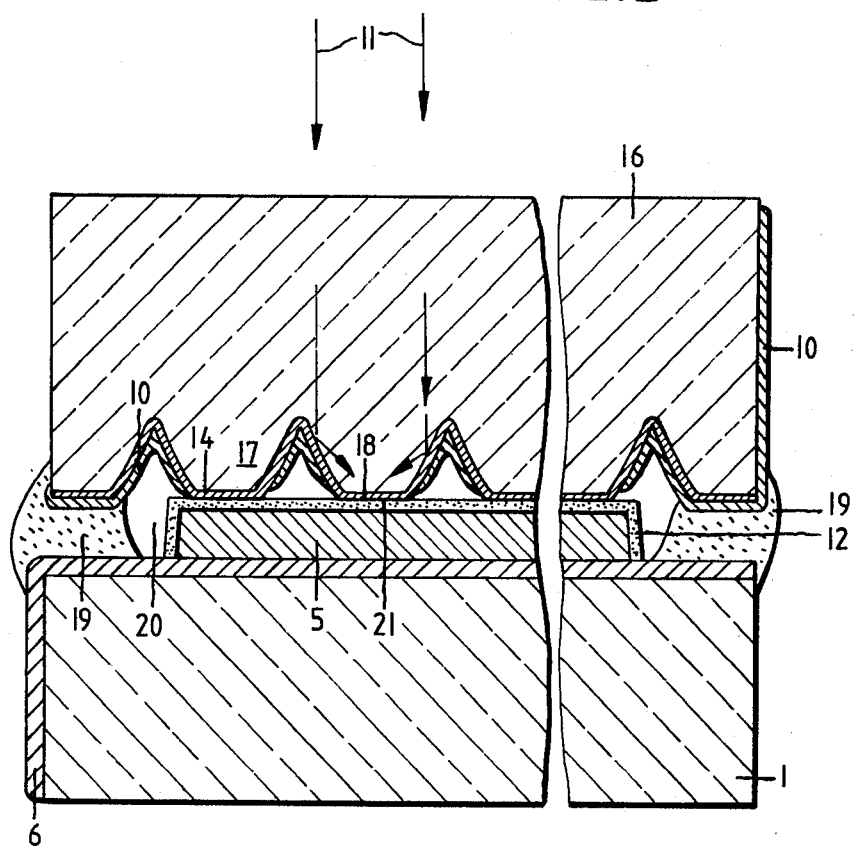
FIG. 5 shows a semiconductor layer solar cell on a metallized insulator substrate with a p-conductive silicon layer and SIS Structure having pressure contacts between the semiconductor layer and a light transmitting molded body produced in accordance with the teachings of the present invention.

As shown in FIG. 5, a glass substrate 1 is provided, and has the dimensions 25 cm $\times$ 25 cm $\times$ 0.3 cm. On this glass substrate 1, an aluminum layer 6 of $1 \times 10^{-2}$ cm thickness is applied. A p-conductive silicon layer 5 is applied to aluminum layer 6 with a plasma jet according to the invention, to a thickness of $2 \times 10^{-2}$ cm. The exposed surface of the silicon layer 5 is covered by a $SiO_2$ layer 12 which has a thickness of $2 \times 10^{-7}$ cm and which is formed by oxidation in an oxygen containing atmosphere.

A light transmitting molded body 16 is provided in the form of a glass plate having the dimensions of 25 cm $\times$ 25 cm $\times$ 0.3 cm. On its underside, glass plate 16 is provided with paraboloid shaped raised portions 17 which grow out of square bases having a size of 0.5 mm $\times$ 0.5 mm each. These square bases result in a continuous area of 24 cm $\times$ 24 cm. The paraboloid shaped raised portions 17 are cut off in their focal planes to form sectional areas 18. A layer 14 of 90 parts $SnO_2$ plus 10 parts $In_2O_3$ is applied to the entire surface of the paraboloid shaped raised portions 17 to a thickness of $2 \times 10^{-5}$ cm. Then, an aluminum layer 10 of $5 \times 10^{-3}$ cm thickness is applied to the surface of the previously applied layer 14 except in sectional areas 18. Glass plate 16 together with the paraboloid shaped raised portions is then placed onto the silicon layer 5 in such a way that a sectional area 18 coated with layer 14 rests on $SiO_2$ layer 12 of silicon layer 5. The edges of the two glass plates 1 and 16 are the fused in vacuum with the aid of glass solder 19 so that the external atmospheric pressure produces approximately 230,000 electrically parallel SIS Structure having pressure contacts 21 between the paraboloid shaped raised portions 17 and the semiconductor layer. Sunlight 11 is concentrated by sectional areas 18 of paraboloid shaped raised portions 17 in such a way that it enters into the semiconductor layer 5 through the contacts 21 with about 5 times the intensity of the original solar radiation. Due to extremely good heat dissipation in the dot-shaped pressure contacts 21, there will develop no noticeable excess temperature in contacts 21. The photovoltage of the solar cell is generated between aluminum layers 6 and 10.

It should also be noted that the paraboloid shaped design of the raised portions is of particular significance in the formation of the pressure contacts, the significance of which is not limited to the present invention.

It will be understood that the above description of the present invention is susceptible to various modifications, changes, and adaptions, and the same are intended to be comprehended within the meaning and range of equivalents of the appended claims.

What is claimed is:

1. In a method for producing a semiconductor layer solar cell by applying a semiconductor layer to a substrate by plasma spraying, in which a semiconductor material is brought out of the plasma zone of the plasma spraying means, the improvement comprising maintaining the energy density in the plasma zone sufficiently high such that the semiconductor vaporizes and is brought out of the plasma zone in the form of a vapor jet, and condensing the vapor jet on the substrate in the form of a semiconductor layer.

2. Method as defined in claim 1, wherein the substrate on which the vapor jet is condensed is disposed in a vacuum.

3. Method as defined in claim 1, wherein the plasma spraying means comprises two electrodes made of semiconductor material.

4. Method as defined in claim 1, wherein the semiconductor material is introduced into the plasma zone in the form of a powder.

5. Method as defined in claim 1, wherein the semiconductor material is introduced into the plasma zone in the form of a rod which extends into the plasma zone, wherein the end of the rod melts in the plasma zone and vaporizes.

6. Method as defined in claim 1, wherein the plasma spraying means includes electrodes made of a semiconductor material which vaporizes in the plasma, and is condensed on the substrate.

7. Method as defined in claim 1, wherein the plasma spraying means includes a carrier gas comprising oxygen-free hydrogen or nitrogen or noble gas, or a mixture thereof.

8. Method as defined in claim 1, wherein the plasma of the plasma spraying spraying means burns only in the vapor of the semiconductor material.

9. Method as defined in claim 1, wherein the plasma spraying means is water-stabilized and the plasma burns in dissociated water vapor with an excess of hydrogen.

10. Method as defined in claim 1, wherein the substrate comprises an electrically conductive material.

11. Method as defined in claim 1, wherein the substrate comprises an electrically insulating material which is coated at least in part with an electrically conductive coating.

12. Method as defined in claim: 1, wherein the semiconductor material is n-conductive or p-conductive silicon, germanium, carbon, boron, a Group III/Group V compound or a Group II/Group VI compound.

13. Method as defined in claim 1, additionally comprising providing a pn-junction near the surface on one side of the semiconductor layer.

14. Method as defined in claim 1, additionally comprising providing a light transmitting Schottky contact on one side of the semiconductor layer.

15. Method as defined in claim 1, additionally comprising providing a light transmitting hetero-junction on one side of the semiconductor layer.

16. Method as defined in claim 13, 14, or 15, wherein said one side is the side of the semiconductor layer which is removed from the substrate.

17. Method as defined in claim 1, additionally comprising coating the semiconductor layer with an insulating layer of a thickness less than $1 \times 10^{-6}$ cm.

18. Method as defined in claim 17, wherein the thickness of said insulating layer is about $2 \times 10^{-7}$ cm.

19. Method as defined in claim 1, wherein said layer of semiconductor material is applied in an atmosphere which contains a gas which is non-reactive or slightly reactive with said semiconductor material, but which is highly reactive with impurities in said semiconductor material.

20. Method as defined in claim 1, additionally comprising raising the temperature of the substrate so that the substrate is at an elevated temperature during the application of the semiconductor layer.

21. Method as defined in claim 1, wherein the semiconductor layer is applied to the substrate in a structured manner with the aid of a mask.

22. Method as defined in claim 1, additionally comprising briefly heating or melting the semiconductor layer with an electric arc jet or plasma jet, after applying the semiconductor layer.

* * * * *